Dec. 16, 1969 D. M. BAUER 3,484,668

AMPLIFIER WITH COMBINED VOLTAGE AND CURRENT GAIN

Filed July 17, 1968

INVENTOR
DOUGLAS M. BAUER

BY Richard E. Hosley

ATTORNEY

United States Patent Office 3,484,668
Patented Dec. 16, 1969

3,484,668
AMPLIFIER WITH COMBINED VOLTAGE AND CURRENT GAIN

Douglas M. Bauer, Danvers, Mass., assignor to General Electric Company, a corporation of New York Filed July 17, 1968, Ser. No. 745,422
Int. Cl. H02p 5/54
U.S. Cl. 318—18 6 Claims

ABSTRACT OF THE DISCLOSURE

A power amplifier specifically adapted for driving a servomotor. A drive A-C signal is applied to base-emitter junctions of complementary transistors and is 90° displaced from a reference signal applied to the motor reference winding. Each collector is connected through one of the motor control windings to a D-C power supply terminal.

BACKGROUND OF THE INVENTION

This invention generally relates to power amplifiers and more specifically to power amplifiers for controlling servomotors.

Circuits designated for driving servomotors have usually been linear amplifiers operating class A or class B. As is well known, a class A amplifier does not provide efficient power amplification. Further, in servomotor applications an unbalanced direct current component has existed in the windings. Two adverse results occur which are traceable to a slot effect produced by the direct current. First, the motor is slowed below its normal operating speed. A second and related adverse effect is motor heating which can damage the motor.

Class B amplifiers inherently have a more efficient power amplification rating. In the prior art, transformers have coupled the load current through the amplifier to the motor windings. Inverters have been required to obtain the necessary phase orientation. Finally, it has also been necessary to incorporate discrete voltage amplifiers and current amplifiers in combination to obtain sufficient power gain.

In many of the prior art amplifying circuits, a number of discrete amplifiers have been required to couple a servomotor to an operational amplifier circuit constituted by integrated circuit means. Generally, the output voltage from such integrated circuit operational amplifiers is of a relatively low value. Therefore, it was necessary to include additional voltage amplifiers to attain workable voltage levels.

Therefore, it is an object of this invention to provide a power ampifier especially adapted for a servomotor which provides efficient power amplification.

Another object of this invention is to provide a servo power amplifier which produces voltage and current gain in a single stage.

Still another object of this invention is to provide a servo power amplifier which may be driven directly from integrated circuits.

SUMMARY

In accordance with one aspect of this invention, an alternating current signal is simultaneously applied as in input to complementary transistor amplifiers. The amplifiers are rendered alternatively conductive by the alternating current signal through first and second isolated servomotor control windings which connect the transistors to D-C voltages of opposite polarity. Voltage and current gains are thereby obtained in a single stage.

This invention has been pointed out with particularity in the appended claims. A more thorough appreciation of the above and further objects and advantages of this invention may be attained by referring to the following detailed description taken in conjunction with the accompanying drawings.

DESCRIPTION OF ILLUSTRATIVE EMBODIMENTS

Figure 2:
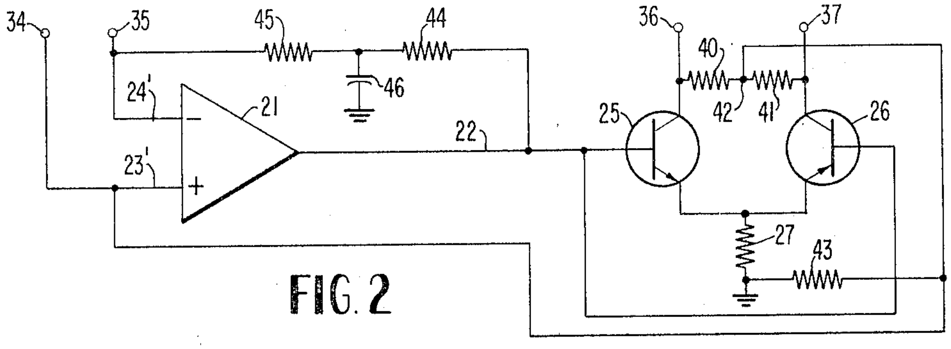
FIGURE 2 is a schematic of another embodiment of this invention.
Figure 3:
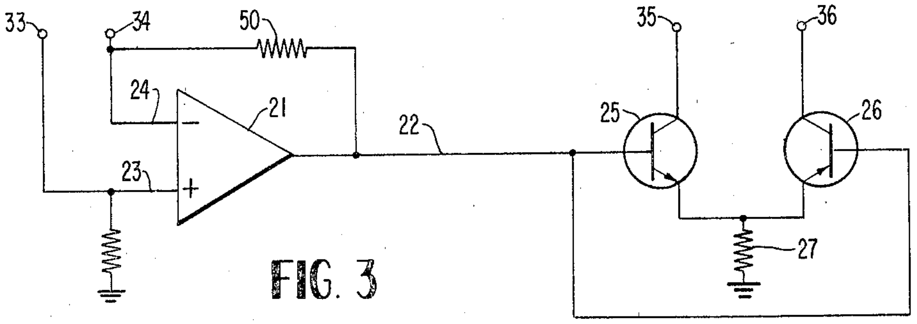
FIGURE 3 is a schematic of a third embodiment of this invention.

The circuit embodiments in each figure are basically the same. Feedback circuit modifications provide different operational characteristics. Therefore, a single reference to the basic circuit in FIGURE 1 will indicate the operation and major advantages of this servo drive system. FIGURES 2 and 3 are analyzed only as to their feedback circuits. Like numerals refer to like elements throughout.

Figure 1:
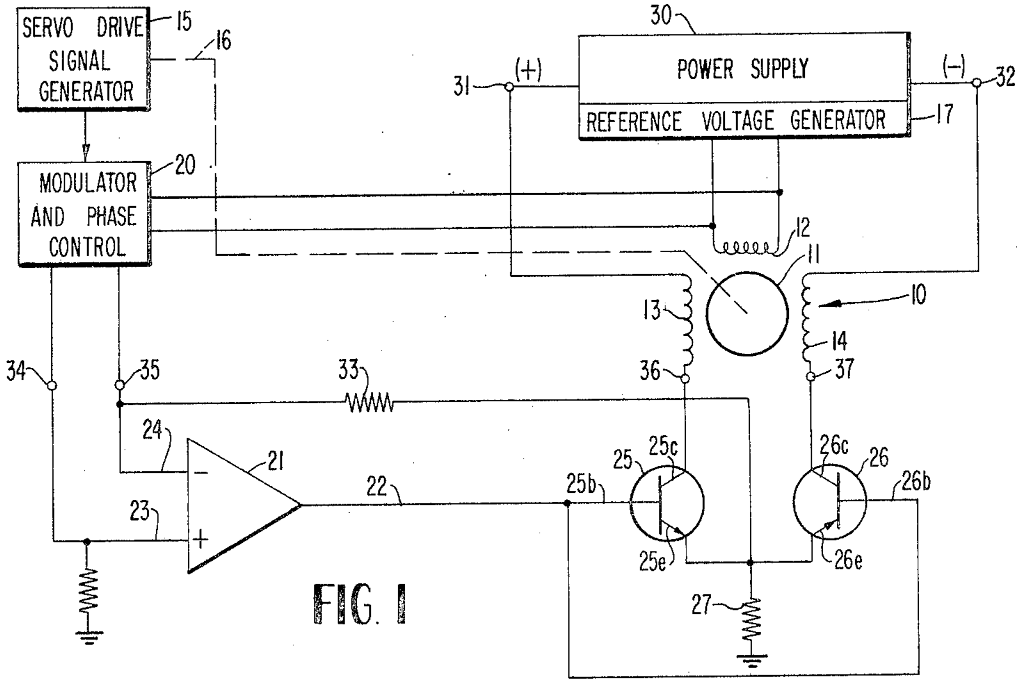
FIGURE 1 is a schematic of a power amplifier adapted for driving a servo system.

In FIGURE 1 the servo system includes a servomotor 10 having an armature 11, a reference winding 12 and first and second isolated control windings 13 and 14. Generally the operation of such a system is known. The position of the armature 11 is transmitted to a servo drive signal generator 15 by linkage 16. In the servo drive signal generator 15 the actual and desired armature positions are compared to generate an error signal. This signal is modified to appear as an A-C voltage which energizes the control windings. The control winding voltage is substantially 90° phase displaced from the voltage applied to the reference winding. The direction of the phase displacement indicates a plus or minus error while the A-C signal amplitude is responsive to the error magnitude.

In accordance with this invention a reference voltage generator 17 energizes the reference winding 12 and a modulator and phase control circuit 20. This control circuit serves two purposes. It converts an error signal from the servo drive signal generator 15 to an alternating current signal. Also it maintains the proper phase relationship between the voltages on the reference winding and the control windings.

The A-C signal generated by modulator and phase control circuit 20 is applied to an operational amplifier 21 to thereby produce an A-C output voltage on the conductor 22. As the positive input 23 is coupled to ground and the signal is applied to the inverting input 24, the voltage on the conductor 22 is 180° phase displaced from the input voltage.

The amplifier output signal is applied simultaneously to complementary transistors constituted by an NPN transistor 25 and a PNP transistor 26. Both base eletcrodes **25*b* and 26*b* are directly connected to the conductor 22. Emitters 25*e* and 26*e* form a common junction and are coupled to ground through an emitter swamping resistor 27. The collector 25*c* is in series with the control winding 13 and is energized by a D-C power supply 30 having a positive terminal 31. Similarly the collector 26*c* is in series with the control winding 14 and is coupled therethrough to a negative output terminal 32. The voltages at the terminals 31 and 32** are equal in magnitude when taken with respect to ground.

Therefore, both collector-emitter junctions are biased for conduction by the power supply 30. When the voltage on the conductor 22 is positive with respect to ground, the transistor 25 conducts. During opposite half cycles the transistor 26 conducts. If a sine wave appears on the conductor 22, then one-half the sine wave will be applied to each of the control windings 13 and 14 during alternate half cycles. Further, if both transistors are operated at the proper point, distortion is minimized provided neither transistor 25 nor 26 saturates. As both the control windings 13 and 14 are inductive, a peak-to-peak voltage of twice the voltage at either terminal 31 or 32 with respect to ground will occur during each half cycle. Each of the transistors 25 and 26 also provide a current gain over the current in the conductor 22. Therefore, simultaneous current and voltage gain are attained in a single amplifying stage.

In one particular embodiment shown in FIGURE 1 the control windings introduce substantially 60° of phase shift in the signal while about 30° of additional phase shift is generated by the operational amplifier 21. As the two phase shifts are aiding, it is merely necessary for the modulator and phase control circuit 20 to maintain the output signal therefrom in phase with the reference voltage generator 17. In other embodiments it may be necessary to introduce sufficient phase shift by this circuit to maintain the quadrature relationship.

Altering the feedback varies the overall system operation. In FIGURE 1 current feedback is introduced by connecting a resistor 33 from the emitter swamping resistor 27 to the inverting input 24. As the transistors 25 and 26 alternately conduct, an in-phase voltage is generated across the emitter swamping resistor 27. This voltage is coupled to the inverting input 24 to provide negative feedback. In addition, when the signal on the conductor 22 approaches zero, both the transistors 25 and 26 will be non-conductive causing the voltage across the emitter swamping resistor 27 to go to zero. No feedback occurs. Therefore, the amplifier 21 operates with open loop gain; and the output signal on the conductor 22 quickly traverses the zero point. An analysis of the current and voltage energizing the control windings shows that the output approaches class B operation with only negligible variations.

A system for using voltage feedback to attain class B operation is shown in FIGURE 2. Terminals 23' and 24' are differential amplifier inputs of the operational amplifier 21. Terminals 34 and 35 are analogous to terminals 34 and 35 in FIGURE 1 which are adapted to be connected to the modulator and phase control circuit 20. Terminals 36 and 37 serve as connecting points for the control windings 13 and 14 respectively. A voltage divider, comprising resistors 40 and 41 interconnected at a junction 42, is in series between the collectors **25*c* and 26*c*. A grounded resistor 43 connected to the junction 42 develops an A-C feedback voltage which is coupled to the positive input 23'. When both transistors 25 and 26 are non-conductive in the region near a zero input voltage, the voltage at the junction 42 goes to zero; and the amplifier 21 assumes an open loop gain operating mode to again cause fast traverse of the zero point. D-C bias for the amplifier is provided by resistors 44 and 45 in series between the conductor 22 and the inverting amplifier input 24'. Alternating current components are filtered through a condenser 46 coupling the junction of the resistors 44 and 45** to ground.

When class C operation is desired or when square wave operation is desired, the circuit of FIGURE 3 can be utilized. The positive input 23 is again grounded while a feedback resistor 50 connects the output conductor 22 to the inverting input 24. This is a conventional feedback loop. Therefore, a definable time element will exist as the voltage on the conductor 22 goes through zero when neither the transistor 25 nor the transistor 26 is conducting.

In accordance with this invention a servo drive system has been described which provides voltage and current gain at a single amplifier stage. It will be obvious that many modifications may be made to the particular energizing circuitry, the output circuitry and the feedback loops. It is the object of the appended claims to cover all such modifications and variations as come within the true spirit and scope of the claims.

What is claimed as new and desired to be secured by Letters Patent of the United States is:

1. A servo system adapted to be responsive to a servo drive signal comprising:

(a) a servomotor including a reference winding and a pair of isolated, cooperative control windings, (b) means for energizing said reference winding with a predetermined phase A-C signal connected thereto, (c) means for generating an A-C signal in response to the servo drive signal, (d) power supply means for producing D-C voltages at a positive terminal and a negative terminal with respect to ground, and (e) a pair of complementary solid state amplifiers each including input terminals connected to said generating means, interconnected common terminals and output terminals, one of said control windings and said output and common terminals of one of said amplifiers being in series with said positive terminal and ground, the other of said control windings and said output and common terminals of said other amplifier being in series between said negative terminal and ground, so said amplifiers are forward biased by said D-C power supply and conductive only during alternate half cycles of the A-C signal, said generating means and said control windings shifting the phase of the control winding voltage to be displaced in phase from the reference signal.

2. A servo system as recited in claim 1 wherein said complementary amplifiers are constituted by NPN and PNP transistors having bases connected to said generating means and emitters coupled to ground, said NPN transistor having a collector in series with said one control winding energized from said positive terminal and said PNP transistor having a collector connected to the other of said control windings to be energized from said negative terminal.

3. A servo system as recited in claim 2 wherein said generating means is constituted by an operational amplifier having positive and negative input terminals and an output terminal connected to said bases, said servo system additionally comprising feedback means responsive to the A-C signal for coupling feedback to said negative input terminal.

4. A servo system as recited in claim 3 wherein said emitters are resistively coupled to ground, said feedback means including a feedback resistor connected to said emitters and said negative input terminal.

5. A servo system as recited in claim 3 wherein said feedback means comprises a feedback resistor connected between said output and negative input terminals.

6. A servo system as recited in claim 3 wherein said feedback means comprises a voltage divider connected between said collectors, a first feedback resistor for grounding a midpoint of said voltage divider for producing a feedback voltage to be coupled to said positive input terminal and impedance means including an A-C signal filter for coupling a direct current from said output terminal to said negative input terminal.

References Cited

UNITED STATES PATENTS

| | | | |
|---|---|---|---|
| 3,003,096 | 6/1961 | Du Bois | 318—207 |
| 3,101,437 | 8/1963 | Photinos | 318—207 |
| 3,153,754 | 10/1964 | McDonald | 318—28 |
| 3,406,309 | 10/1968 | Martens | 318—18 XR |

B. DOBECK, Primary Examiner

U.S. Cl. X.R.

318—207